(12) United States Patent
Koelmel et al.

(10) Patent No.: US 8,490,660 B2
(45) Date of Patent: *Jul. 23, 2013

(54) APPARATUS AND METHOD FOR SUPPORTING, POSITIONING AND ROTATING A SUBSTRATE IN A PROCESSING CHAMBER

(75) Inventors: Blake Koelmel, Palo Alto, CA (US); Alexander N. Lerner, San Jose, CA (US); Joseph M. Ranish, San Jose, CA (US); Kedarnath Sangam, Sunnyvale, CA (US); Khurshed Sorabji, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/294,709

(22) Filed: Nov. 11, 2011

(65) Prior Publication Data

US 2012/0055405 A1 Mar. 8, 2012

Related U.S. Application Data

(63) Continuation of application No. 11/746,392, filed on May 9, 2007, now Pat. No. 8,057,601.

(51) Int. Cl.
*B65B 31/04* (2006.01)
(52) U.S. Cl.
USPC .............. 141/65; 141/82; 118/730; 406/88; 219/411; 414/757

(58) Field of Classification Search
USPC ... 118/728, 500, 730, 52; 141/65, 82; 406/88, 406/86; 219/411; 414/757, 753
See application file for complete search history.

(56) References Cited

U.S. PATENT DOCUMENTS

| | | | |
|---|---|---|---|
| 3,982,627 A | * | 9/1976 | Isohata .......................... 414/757 |
| 4,495,024 A | | 1/1985 | Bok |
| 4,544,446 A | | 10/1985 | Cady |
| 4,681,776 A | * | 7/1987 | Bok ............................ 427/255.5 |
| 4,738,748 A | * | 4/1988 | Kisa ............................. 438/727 |
| 4,922,853 A | | 5/1990 | Hofer |

(Continued)

FOREIGN PATENT DOCUMENTS

CN 1824393 A 8/2006

OTHER PUBLICATIONS

CoreFlow: "Thermal Platforms", http://www.coreflow.com/page.asp?cat=140&type=2&lang=1, Jan. 28, 2008.

(Continued)

*Primary Examiner* — Jason K Niesz
(74) *Attorney, Agent, or Firm* — Patterson & Sheridan, LLP

(57) ABSTRACT

An apparatus and method for supporting, positioning and rotating a substrate are provided. In one embodiment, a support assembly for supporting a substrate includes an upper base plate and a lower base plate. The substrate is floated on a thin layer of air over the upper base plate. A positioning assembly includes a plurality of air bearing edge rollers or air flow pockets used to position the substrate in a desired orientation inside above the upper base plate. A plurality of slanted apertures or air flow pockets are configured in the upper base plate for flowing gas therethrough to rotate the substrate to ensure uniform heating during processing.

14 Claims, 7 Drawing Sheets

U.S. PATENT DOCUMENTS

| | | | |
|---|---|---|---|
| 5,194,406 A | | 3/1993 | Bok et al. |
| 5,226,383 A | * | 7/1993 | Bhat .......................... 118/730 |
| 5,248,380 A | | 9/1993 | Tanaka |
| 5,489,341 A | | 2/1996 | Bergman et al. |
| 5,584,310 A | | 12/1996 | Bergman et al. |
| 5,761,023 A | | 6/1998 | Lue et al. |
| 5,997,963 A | | 12/1999 | Davison et al. |
| 6,001,175 A | * | 12/1999 | Maruyama et al. ........... 117/102 |
| 6,005,226 A | * | 12/1999 | Aschner et al. ............... 219/390 |
| 6,099,056 A | * | 8/2000 | Siniaguine et al. .......... 294/64.3 |
| 6,102,057 A | | 8/2000 | Vogtmann et al. |
| 6,113,702 A | | 9/2000 | Halpin et al. |
| 6,183,565 B1 | | 2/2001 | Granneman et al. |
| 6,239,038 B1 | | 5/2001 | Wen |
| 6,343,183 B1 | | 1/2002 | Halpin et al. |
| 6,402,843 B1 | * | 6/2002 | Siniaguine et al. ........... 118/500 |
| 6,454,865 B1 | * | 9/2002 | Goodman et al. ............ 118/728 |
| 6,454,866 B1 | * | 9/2002 | Halpin et al. ................. 118/730 |
| 6,491,757 B2 | | 12/2002 | Halpin et al. |
| 6,505,635 B1 | | 1/2003 | Vogtmann et al. |
| 6,692,576 B2 | | 2/2004 | Halpin et al. |
| 6,720,263 B2 | | 4/2004 | Olgado et al. |
| 6,839,507 B2 | | 1/2005 | Adams et al. |
| 6,932,558 B2 | * | 8/2005 | Wu ................................ 414/757 |
| 7,312,156 B2 | | 12/2007 | Granneman et al. |
| 7,351,293 B2 | * | 4/2008 | Kuznetsov et al. ........... 118/730 |
| 7,604,439 B2 | * | 10/2009 | Yassour et al. .................. 406/88 |
| 2001/0018276 A1 | * | 8/2001 | Suzuki ........................... 438/800 |
| 2001/0051499 A1 | * | 12/2001 | Shinozaki ...................... 451/285 |
| 2002/0179589 A1 | * | 12/2002 | Morita et al. .................. 219/411 |
| 2003/0168174 A1 | * | 9/2003 | Foree ......................... 156/345.51 |
| 2005/0091992 A1 | * | 5/2005 | Aggarwal et al. .................. 62/62 |
| 2005/0126605 A1 | | 6/2005 | Yassour et al. |
| 2005/0145180 A1 | | 7/2005 | Aggarwal et al. |

OTHER PUBLICATIONS

CoreFlow: "From Technology to Solution", http://www.coreflow.com/page.asp?cat=79&type=2&lang=1, Feb. 14, 2008.

CoreFlow: "Smart Nozzles", http://www.coreflow.com/page.asp?cat=113&type=2&lang=1, Feb. 14, 2008.

CoreFlow: "Handling", http://aop.co.il/customers/core/page.asp?cat=66&lang=1&type=2, Jan. 28, 2008.

CoreFlow: "XY(Z) Accurate Platforms", http://aop.co.il/customers/core/page.asp?cat=138&type=2&lang=1, Jan. 28, 2008.

CoreFlow: "Coating", http://aop.co.il/customers/core/pape.asp?cat=65&lang=1&type=2 Jan. 28, 2008.

CoreFlow: "Thermal Process"—http://www.coreflow.com Jul. 25, 2007.

Tru-Si Technologies, "No Touch Handling" http://www.trusi.com/notouchhandling.html Jul. 25, 2007.

ASM International N.V.: Products—"Levitor", http://asm.com/index.php?option=com_content&task=view&id=13&Itemid=52 Jan. 28, 2008.

Kuznetsov et al., "LEVITOR 4000: An Advanced RTP System Based on Conductive Heat Transfer," 197th Meeting of The Electrochemical Society—Toronto, Ontario, Canada May 14-18, 2000, pp. 1-10.

Granneman et al., "Fast-Ramp, Low-Temperature, Annealing in the LEVITOR Floating Wafer System," Rapid Thermal and Other Short-Term Proc. Technol. II, 199th ECS meeting, Washington DC, Mar. 26-29, 2001, pp. 1-9.

Granneman et al., "The LEVITOR 4000 System, Ultra-fast, Emissivity-independent, Heating of Substrates Via Heat Conduction Through Thin Gas Layers," RTP-2001 Mie, Japan, Nov. 2001, pp. 1-6.

International Search Report and Written Opinion dated Sep. 7, 2009 for International Application No. PCT/US2009/030996.

International Search Report and Written Opinion of the International Searching Authority dated Aug. 22, 2008 (PCT/US08/63105).

Second Office Action dated Jul. 4, 2012 for Chinese Application No. 2008800129212.

Search Report dated Jul. 4, 2012 for Chinese Application No. 2008800129212.

\* cited by examiner

APPARATUS AND METHOD FOR SUPPORTING, POSITIONING AND ROTATING A SUBSTRATE IN A PROCESSING CHAMBER

CROSS-REFERENCE TO RELATED APPLICATIONS

This application is a continuation of U.S. patent application Ser. No. 11/746,392, filed May 9, 2007 now U.S. Pat. No. 8,057,601.

BACKGROUND OF THE INVENTION

1. Field of the Invention

The present invention relates generally to the field of semiconductor processing, and more specifically, to supporting, positioning or rotating a substrate during semiconductor device fabrication in a processing chamber.

2. Background of the Related Art

Integrated circuits have evolved into complex devices that can include millions of transistors, capacitors and resistors on a single chip. The evolution of chip design continually requires faster circuitry and greater circuit density that demand increasingly precise fabrication processes. One fabrication process frequently used is ion implantation.

Ion implantation is particularly important in forming transistor structures on semiconductors and may be used many times during chip fabrication. During ion implantation, silicon substrates are bombarded by a beam of electrically charged ions, commonly called dopants. Implantation changes the properties of the material in which the dopants are implanted to achieve a particular level of electrical performance. Dopant concentration is determined by controlling the number of ions in a beam of energy projected on the substrate and the number of times the substrate passes through the beam. The energy level of the beam typically determines the depth at which the dopants are placed. These dopants are accelerated to an energy level that will permit the dopants to penetrate or implant into the film at a desired depth.

During ion implantation, the implanted film often develops a high level of internal stress. In order to relieve the stress and further control the resulting properties of the implanted film, the film is typically subjected to a thermal process, such as annealing. Post-ion implantation annealing is typically performed in a rapid thermal processing (RTP) chamber that subjects the substrate to a very brief, yet highly controlled thermal cycle that can heat the substrate from room temperature to over 1000° C. in less than 10 seconds. RTP relieves the stress induced during implantation and can be used to further modify film properties such as changing the electrical characteristics of the film.

Generally, an RTP chamber includes a radiant heat source or lamp, a chamber body and a substrate support ring. The lamp is typically mounted to a top surface of the chamber body so that the radiant energy generated by the lamp impinges upon the substrate supported by the support ring within the chamber body. A quartz window is typically disposed in the top surface of the chamber body to facilitate the transfer of energy between the lamp and the substrate. The support ring is typically comprised of silicon carbide and extends from a bottom of the chamber body to support the substrate by its outer edge. An external motor is used to rotate the substrate and the support ring to compensate for variations in the radiant energy generated by the lamp impinging across the substrate surface that could heat the substrate non-uniformly. Typically, the RTP process is performed at a reduced pressure to minimize potential particle and chemical contamination of the substrate.

While RTP processes can heat and cool a substrate quickly, RTP processes often heat the entire thickness of the substrate. Uneven heating across the surface of the substrate can be a problem that is often experienced with RTP or other conventional substrate heating processes. For example, temperature variation often occurs in the area where the support ring contacts the outer edge of the substrate. Variation of substrate temperatures also may occur because the radiant heat source is applied to the top surface of the substrate which may include different device materials at various sections of the surface. The different device materials may have wide ranges of emissivities resulting in varying temperatures. Also, the bearing which is used to support and rotate the substrate and assembly is a potential source of substrate contamination and particle generation.

Therefore, is a need for an improved system adapted to support, position, or rotate a substrate during an annealing process which does not require direct contact with the substrate.

SUMMARY OF THE INVENTION

An apparatus and method for supporting, positioning and rotating a substrate are generally provided. In one embodiment, a substrate support assembly is provided. The assembly includes a base plate which is configured to provide a first flow of gas for elevating a substrate, a temperature controlled thermal edge barrier which, at least partially, circumscribes the substrate, and ways for substrate to be positioned the inside the thermal edge barrier. The base plate may be made of a transparent material, such as quartz or sapphire. The base plate may have a first plurality of apertures adapted to direct the first flow of gas. The assembly may also include a lower base plate positioned under and in contact with the base plate, and the lower base plate may include a first conduit for directing the first flow of gas to the plurality of apertures. Vacuum may be provided by a second plurality of apertures and the lower base plate may include a second conduit for directing the vacuum to the second plurality of apertures. Grooves may also be used to direct the first flow of gas and to provide vacuum. The means for positioning the substrate may include a plurality of air bearing edge rollers, which may have a sleeve adapted to float on a second flow of gas, and pockets which may have a high pressure well and a low pressure well. The base plate may also include a first plurality of slanted apertures adapted to direct a third flow of gas to rotate the substrate and a second plurality of slanted apertures, slanted at an opposing angle, adapted to direct a fourth flow of gas. Rotation of the substrate may also be obtained through the use of gas flow pockets which may have a high pressure well and a low pressure well.

In another embodiment, a processing chamber is provided. The processing chamber includes a heating lamp assembly configured to heat the substrate, a reflector plate configured to reflect light from the heating lamp assembly; and a substrate support assembly disposed in-between the heating light assembly and the reflector plate. The substrate support assembly includes a base plate which is configured to provide a first flow of gas for elevating a substrate, a thermal edge barrier which, at least partially, circumscribes the substrate, and ways for substrate to be positioned the inside the thermal edge barrier. The base plate may be made of a transparent material, such as quartz or sapphire. The base plate may have a first plurality of apertures adapted to direct the first flow of gas.

The assembly may also include a lower base plate positioned under and in contact with the base plate, and the lower base plate may include a first conduit for directing the first flow of gas to the plurality of apertures. Vacuum may be provided by a second plurality of apertures and the lower base plate may include a second conduit for directing the vacuum to the second plurality of apertures. Grooves may also be used to direct the first flow of gas and to provide vacuum. The means for positioning the substrate may include a plurality of air bearing edge, which may have a sleeve adapted to float on a second flow of gas, and pockets which may have a high pressure well and a low pressure well. The base plate may also include a first plurality of slanted apertures adapted to direct a third flow of gas to rotate the substrate and a second plurality of slanted apertures, slanted at an opposing angle, adapted to direct a fourth flow of gas. Rotation of the substrate may also be obtained through the use of gas flow pockets which may have a high pressure well and a low pressure well.

In another embodiment, a method for supporting, positioning, and rotating a substrate in a substrate processing chamber is provided. The method includes supplying a first gas to a substrate support assembly to elevate the substrate on a flow of gas, confining the elevated substrate within a boundary, and supplying a second gas to rotate the substrate. Vacuum may also be supplied to the substrate support assembly. The first gas may be flowed through a first plurality of apertures disposed in a base plate, and the vacuum may be provided through a second plurality of apertures disposed in the base plate. A pressure difference between the first plurality of apertures and the second plurality of apertures may be between about 5 PSI and about 50 PSI, or between about 10 PSI and about 30 PSI. The second gas may be flowed through a first plurality of slanted apertures disposed in the base plate, through air jets, or gas flow pockets. The elevated substrate may be confined applying a plurality of air bearing edge rollers or gas flow pockets.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
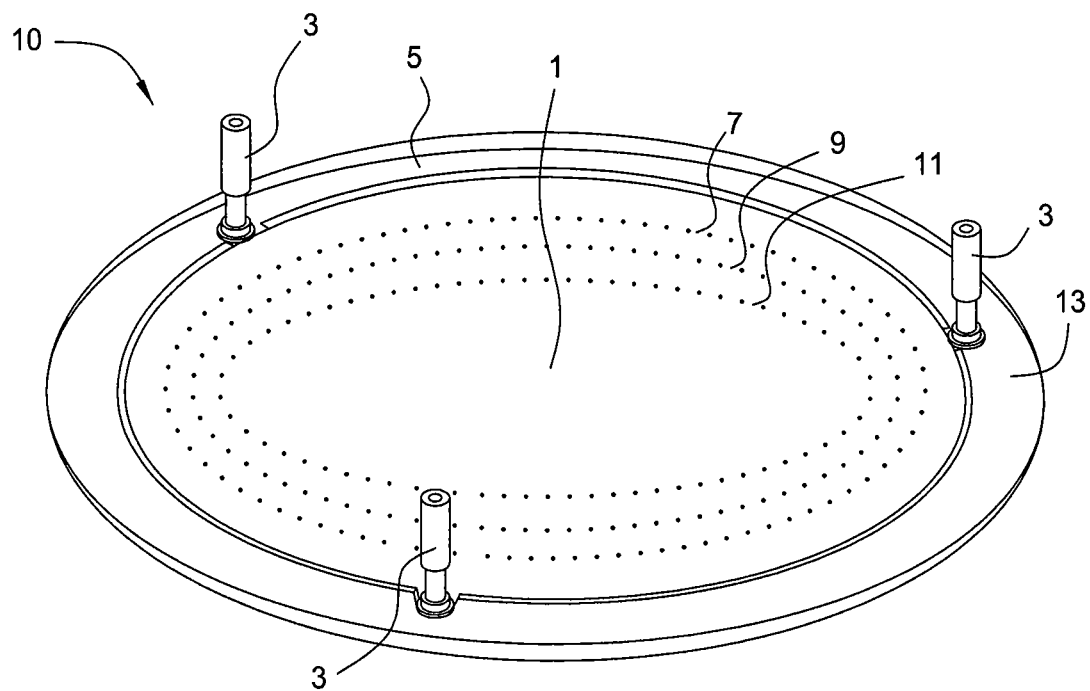
FIG. 1 depicts a perspective view of a substrate support and positioning assembly according to one embodiment of the invention.

FIG. 1 depicts a perspective view of a substrate support and positioning assembly 10 according to one embodiment of the invention. Support and positioning assembly 10 includes a base plate 1, on which a plurality of air bearing edge rollers 3 and a thermal edge barrier 5 may be positioned. Base plate 1 is an annular body and may include a plurality of apertures for flowing gas therethrough to elevate the substrate. Apertures for providing vacuum may also be present. In an embodiment, the plurality of apertures may be arranged in a concentric circular fashion so that three aperture circles are formed on base plate 1. In one embodiment an outer circle of apertures 7 may be adapted to provide vacuum, middle circle of apertures 9 may be adapted to provide a gas, and inner circle of apertures 11 may provide vacuum. Any number of such aperture circles and configurations of vacuum and gas adapted apertures are contemplated. Apertures 7, 9, and 11 may have a diameter of between about $1/2000$ of an inch and about $1/16$ of an inch, preferably between about $1/1000$ of an inch and about $1/32$ of an inch, Base plate 1 may be fabricated from a suitable material that reduces potential scratching, chemical or physical contamination and/or marring of the substrate, for example, stainless steel, aluminum, metal alloys, ceramic or a high temperature polymer. Base plate 1 may alternatively be fabricated from a transparent material such as quartz, sapphire, or a hard transparent mineral. Base plate 1 may be between about $1/16$ of an inch and about 2 inches thick, preferably about $1/8$ of an inch. The sites of apertures 7, 9, and 11 may be counter bored in order to reduce the thickness of base plate 1 at the aperture sites to a thickens which allows for laser drilling or micro machining of apertures 7, 9, and 11. An outer ring 13 may be adhered to base plate 1. The outer ring 13 may be a carbon based material such, as silicon carbide, directly applied to an upper surface of the base plate 1 in a coating formation. Optionally, outer ring 13 may be fabricated from a material that reduces potential scratching of the substrate, such as silicon carbide, and coupled to the upper surface of base plate 1 by the use of adhesives or bonding.

Figure 2:
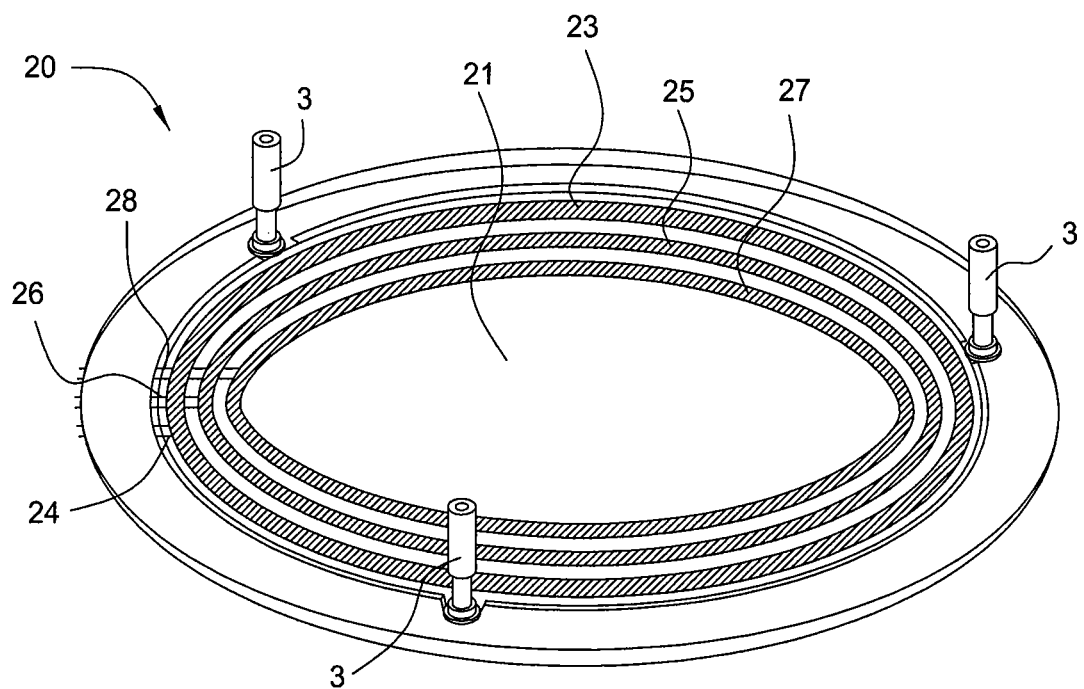
FIG. 2 depicts a perspective view of a substrate support and positioning assembly according to another embodiment of the invention.

FIG. 2 depicts a perspective view of a substrate support and positioning assembly 20 according to another embodiment of the invention. Support and positioning assembly 20 includes a base plate 21, on which the plurality of air bearing edge rollers 3 and the thermal edge barrier 5 may be positioned. Base plate 21 is an annular body and may include one or more annular grooves 25 for flowing gas therethrough to elevate the substrate. One or more annular grooves 23 and 27 for providing vacuum may also be present. In an embodiment, the grooves may be arranged in a concentric circular fashion on base plate 1. In one embodiment an outer groove 23 may be adapted to provide vacuum, middle groove 25 may be adapted to provide a gas, and inner groove 27 may provide vacuum. Any number of grooves and configurations of vacuum and gas adapted grooves are contemplated. Base plate 21 may be fabricated from a suitable material that reduces potential scratching, chemical or physical contamination and/or marring of the substrate, for example, stainless steel, aluminum, metal alloys, ceramic or a high temperature polymer. Base plate 21 may alternatively be fabricated from a transparent material such as quartz, sapphire, or a hard transparent mineral. Base plate 21 may be between about 1/16 of an inch and about 2 inches thick, preferably about 1/8 of an inch. Grooves 23, 25, and 27 may be between about 1/2000 of an inch and about 1/16 of an inch wide, preferably between about 1/1000 of an inch and about 1/32 of an inch, and may be may be between about 1/1000 of an inch and about 1/4 of an inch deep, preferably between about 1/32 of an inch and about 1/16 of an inch. Channels 24, 26, and 28 may provide gas or vacuum to grooves 23, 25, and 27, respectively, and may have diameters between about 1/32 of an inch and about 1/8 of an inch.

Figure 3:
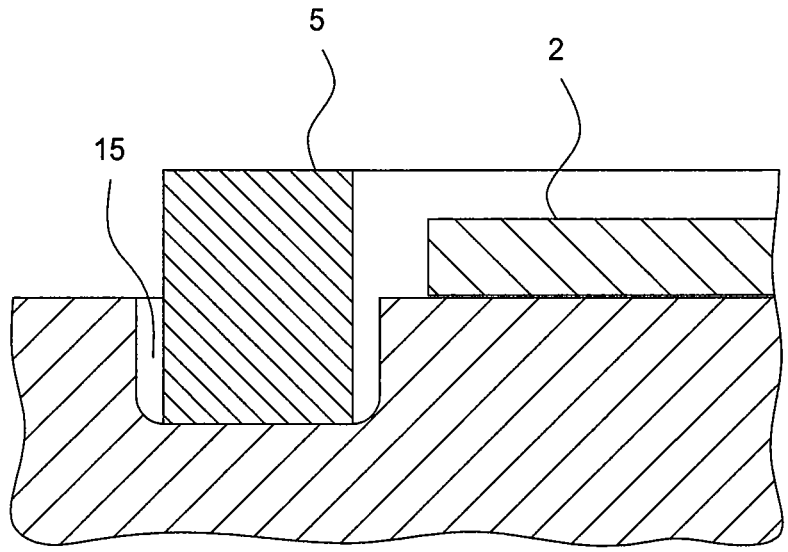
FIG. 3 depicts a partial sectional view of a thermal edge barrier positioned on the support and positioning assembly according to one embodiment of the invention.

FIG. 3 depicts a partial sectional view of the support and positioning assembly according to one embodiment of the invention, showing that the thermal edge barrier 5 may be mounted on top of base plate 1 or 21. The thermal edge barrier 5 is an annular body in the form of a ring which at least partially circumscribes the substrate 2 and limits the movement of the substrate within its boundaries. The thermal edge barrier 5 may be located and secured in an annular groove 15 located in the base plate. The thermal edge barrier 5 may be temperature controlled using laser heating, dedicated lamp zones, or DC heating. The thermal edge barrier 5 may be fabricated from a material that reduces potential scratching, chemical or physical contamination and/or marring of the substrate, for example, silicon carbide, stainless steel, aluminum, ceramic or a high temperature polymer. Alternatively, the thermal edge barrier may be fabricated as a unitary member with the base plate using the same material of the base plate. The thermal edge barrier 5 may have an inner diameter between about 1% and about 20% larger than the diameter of the substrate being processed, preferably between about 2% and about 5%.

Figure 4:
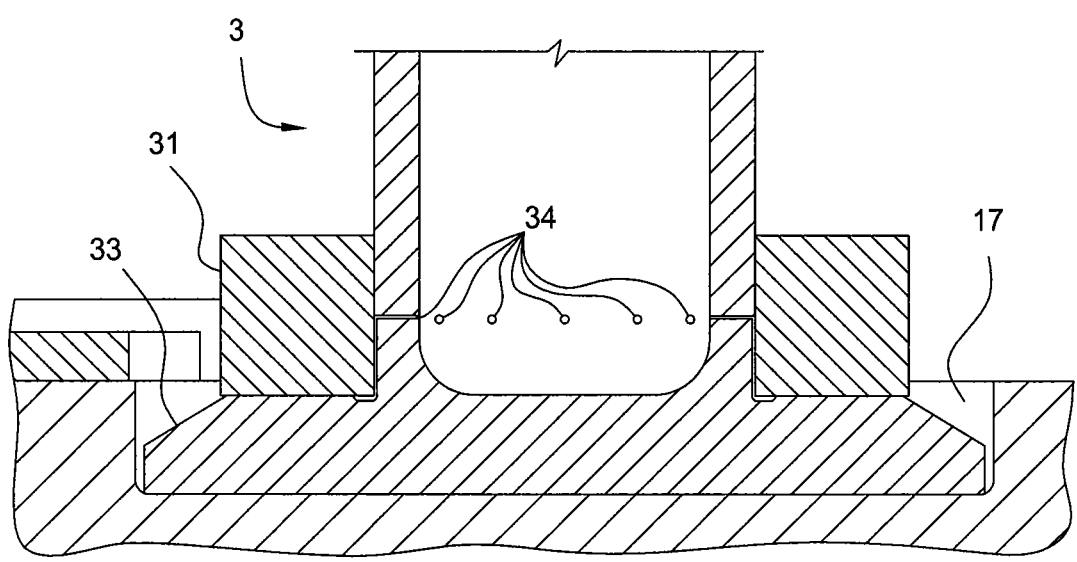
FIG. 4 depicts a perspective view of an air bearing edge roller according to one embodiment of the invention.

FIG. 4 depicts an embodiment of the air bearing edge rollers 3. The air bearing edge roller is adapted to position substrate 2 without the substrate having to contact thermal edge barrier 5. The air bearing edge rollers 3 may rest on the base plate in grooves 17 and may be fabricated from a material that reduces potential scratching, chemical or physical contamination and/or marring of the substrate, for example, a high temperature polymer, granite, or aluminum. A floating sleeve 31 circumscribes the air bearing roller 3. The floating sleeve 31 may be positioned on top of an air bearing journal or lift 33, used to lift the substrate 2 between a loading mode and a processing mode. The air bearing edge rollers 3 may be positioned so that parts of an outer circumference of the floating sleeve 31 is in-line with the thermal edge barrier 5, or slightly radially protruding the thermal edge barrier 5 and defines a boundary as depicted in FIGS. 1 and 2. Floating sleeve 31 may have an outer diameter between about 5 mm and about 150 mm, preferably between about 20 mm and about 50 mm, and may be made from low mass materials such as sapphire or quartz. Gas flowing channels 34 may be evenly spaced and adapted to flow gas to lift floating sleeve 31, so that floating sleeve may rotate freely with minimal friction. Optionally, a plurality of air pins, preferably three, may be used to position the substrate inside the thermal edge barrier.

Figure 5:
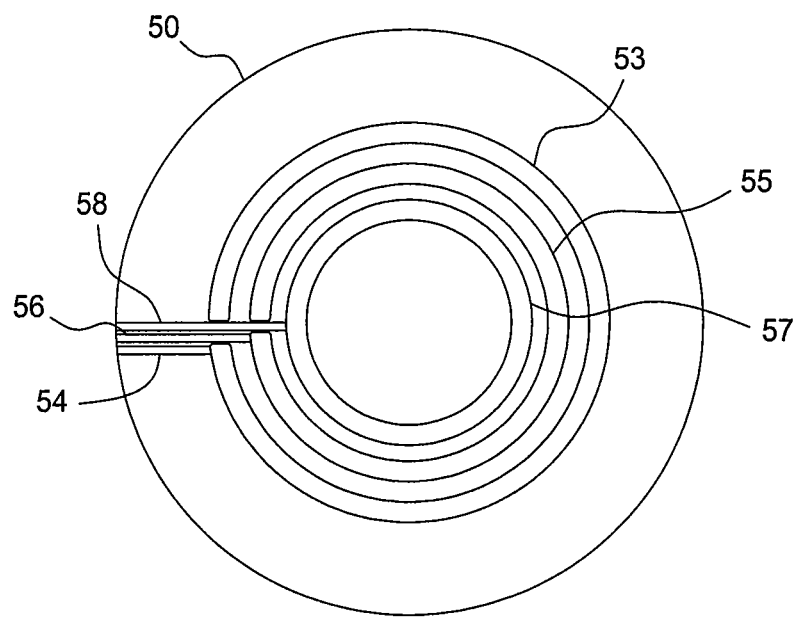
FIG. 5 depicts a top view of a lower base plate according to one embodiment of the invention.

FIG. 5 depicts a top view of a lower base plate 50, according to an embodiment of the invention. Lower base plate 50 is an annular body and may include one or more annular grooves 53, 55, and 57. Lower base plate may be used in conjunction with base plate 1, and provides channels for supplying gas and vacuum to the apertures of base plate 1. Lower base plate may be positioned below and in contact with base plate 1 so that an annular groove 55 aligns with the middle circle of apertures 9 of FIG. 1. The annular groove 55 and base plate 1 thus define a conduit for gas to flow to apertures 9. One or more annular grooves 53 and 57 for providing vacuum may also be present. Annular groove 53 may align with the outer circle of apertures 7, and annular groove 57 may align with the inner circle of apertures 11. In one embodiment outer groove 53 may be adapted to provide vacuum from a channel 54, middle groove 55 may be adapted to provide a gas from a channel 56, and inner groove 57 may provide vacuum from a channel 58. Any number of grooves and configurations of vacuum and gas adapted grooves are contemplated. Lower base plate 50 may be fabricated from a suitable material that reduces potential scratching, chemical or physical contamination and/or marring of the substrate, for example, stainless steel, aluminum, metal alloys, ceramic or a high temperature polymer. Lower base plate 21 may alternatively be fabricated from a transparent material such as quartz, sapphire, or a hard transparent mineral. Lower base plate 50 may be between about 1/16 of an inch and about 2 inches thick, preferably about 1/8 of an inch. Grooves 53, 55, and 57 may be between about 1/2000 of an inch and about 1/16 of an inch wide, preferably between about 1/1000 of an inch and about 1/32 of an inch, and may be may be between about 1/1000 of an inch and about 1/4 of an inch deep, preferably between about 1/32 of an inch and about 1/16 of an inch. Channels 54, 56, and 58 may provide gas or vacuum to grooves 53, 55, and 57, respectively, and may have diameters between about 1/32 of an inch and about 1/8 of an inch.

Figure 6:
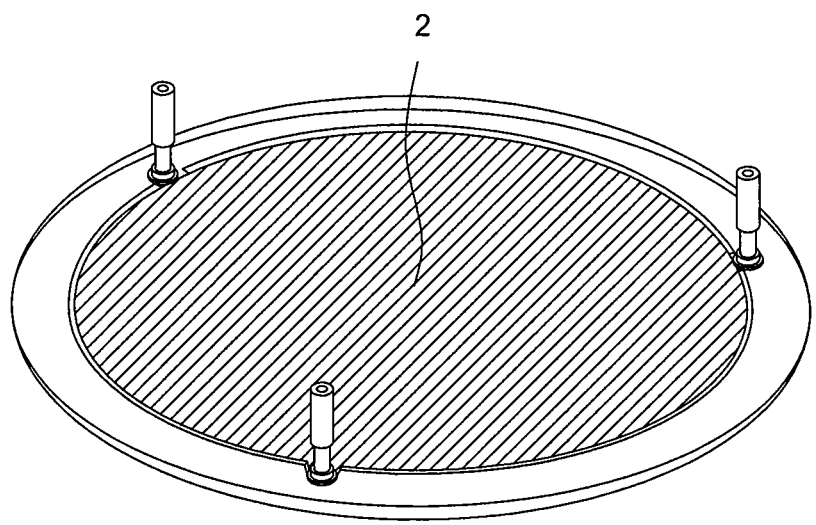
FIG. 6 depicts a perspective view of a support and positioning assembly with a substrate thereon according to one embodiment of the invention.

FIG. 6 depicts a perspective view of a support and positioning assembly with substrate 2 thereon according to one embodiment of the invention. When activated, substrate 2 is elevated and floating above the base plate by an air bearing, or the layer of air, generated between the substrate and the base plate as a result of the low gas flow through the plurality of apertures 9 on base plate 1 or from groove 25 on base plate 21. To gain a desired vertical positioning, a micrometer air cushion, pre-loaded by a vacuum, is applied by having both injection of gas through the plurality of apertures 9 or groove 25 and vacuum of gas through the plurality of apertures 7 and 11 or grooves 23 and 27. Different aperture characteristics may be used for the vacuum and the injection elements in order to build up the required performance in terms of vertical stiffness and positioning accuracy.

Figure 7:
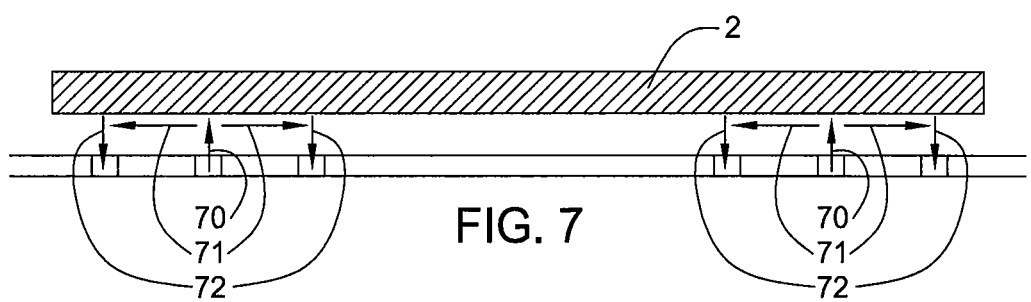
FIG. 7 depicts an elevation of a substrate above a base plate according to one embodiment of the invention.

FIG. 7 depicts an illustration of the gas flow which provides a gas cushion according to an embodiment of the invention. A gas flow 70 is introduced through, for example, apertures 9 or grooves 25, and provides for a gas flow cushion 71. The gas flow cushion 71 elevates substrate 2 between about 1 μm and about 1000 μm, preferably between about 5 μm and about 100 μm. In one embodiment the substrate is elevated about 60 μm. A gas exit flow 72 may escape through apertures 7 and 11 or grooves 23 and 27. Optionally, a sensor (not shown), such as an optical sensor, may be disposed on the outside of the base plate and configured to detect when the substrate is at a predetermined height (e.g., a raised processing position or a lowered substrate transfer position).

Figure 8:
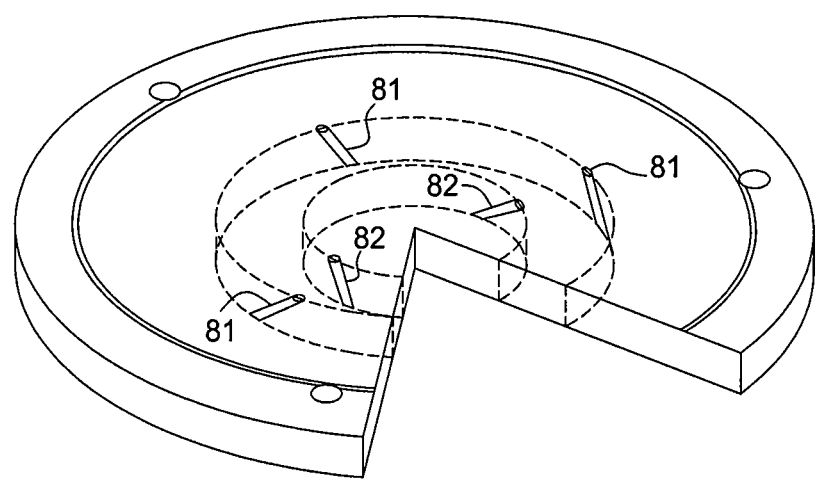
FIG. 8 depicts a perspective view of a base plate according to one embodiment of the invention.

Rotation of substrate 2 may, in one embodiment, be obtained by providing a plurality of slanted apertures may be added to base plate 1 or 21 for flowing gas therethrough to rotate the substrate to ensure uniform heating during processing, as shown in FIG. 8. The plurality of slanted apertures 81 may be equally spaced in a ring formation at a desired distance on the base plate, and may be positioned between the center of the base plate and the circle of apertures 7 or grooves 23. Alternatively, the plurality of slanted apertures 81 may be positioned between apertures 7 or grooves 23 and thermal edge barrier 5. Because there are no moving parts necessary for rotating the substrate, the plurality of slanted apertures 81 enables smoothing, or making more uniform, any uneven temperature distribution on the substrate during processing and provides numerous other processing advantages. The substrate rotation may be controlled, slowed down, or stopped by a counter flow of gas flowing through slanted apertures 82, which may be slanted at an opposite angle as slanted apertures 81. Gas may be supplied to the slanted apertures via corresponding channels in lower base plate 50 as described in relation to FIG. 5. In another embodiment, one or more air jets may be adapted to rotate the substrate. The air jets may be located near an edge of the substrate. Slanted apertures 81, and 82 may have a diameter of between about $\frac{1}{2000}$ of an inch and about $\frac{1}{16}$ of an inch, preferably between about $\frac{1}{1000}$ of an inch and about $\frac{1}{32}$ of an inch. The apertures may be slanted in relation to the top surface of base plate 1 or 21 at an angle between about 10° and about 80°, preferably between about 30° and 60°. Although 3 slanted apertures 81 and 2 slanted apertures 82 are depicted in FIG. 8, any number of such apertures needed to provide rotational control of the substrate is contemplated.

Figure 9:
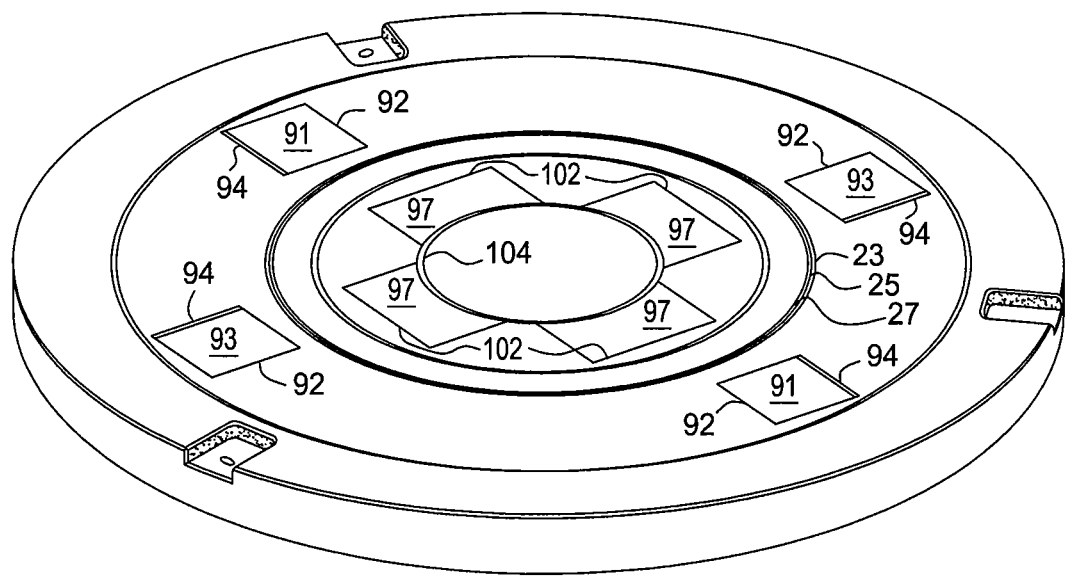
FIG. 9 depicts a perspective view of a base plate according to one embodiment of the invention.

FIG. 9 depicts a perspective view of a base plate 90 showing an alternate method of rotating and positioning substrate 2, according to one embodiment of the invention. Base plate 90 includes gas flow pockets 91 and 93 embedded in face plate 90 which are adapted to provide a rotational force on substrate 2. Gas flow pockets 91 are adapted to provide a counterclockwise rotational force, while gas flow pockets 93 are adapted to provide a clockwise rotational force. Each gas flow pocket may be between about 10 μm and about 30 μm deep relative to the top surface of base plate 90. Gas flow pockets 91 and 93 may have a width of about 10 mm or above, preferably between about 10 mm and about 50 mm. In one embodiment the width may be about 35 mm. Gas flow pockets 91 and 93 may have a length of about 10 mm or above, preferably between about 10 mm and about 50 mm. In one embodiment the length may be about 35 mm.

Gas flow pockets 91 and 93 may include grooves 92 and 94 at opposing lengths of the pockets and extending the width of the pockets. Grooves 92 and 94 may be between about 20 μm and about 80 μm deep relative to the top surface of base plate 90. Grooves 92 may be adapted to provide a gas to become a pressure well and grooves 94 may be adapted to provide a vacuum to become a low pressure well. Gas and vacuum may be supplied to grooves 92 and 94, respectively, via corresponding channels in lower base plate 50 as described in relation to FIG. 5. In one embodiment, gas flow pockets 91 and 93 are radially positioned between grooves 23, 25, and 27, used for providing lift to substrate 2, and temperature controlled thermal edge barrier 5.

Figure 10:
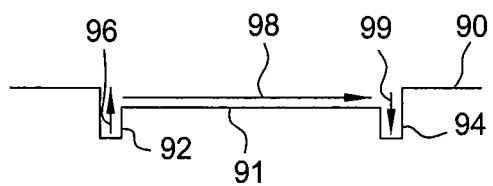
FIG. 10 depicts rotational forces according to one embodiment of the invention.

FIG. 10 depicts a cross-sectional view of a gas flow pocket 91, according to an embodiment of the invention. A flow of gas may be released from groove 92 in a direction of arrow 96. A path of least resistance may lead the gas in the direction of arrow 98 to groove 94 and out of groove 94 in the direction of arrow 99. The movement of gas flow in the direction of arrow 98 may create a friction exerted on the substrate to provide a force to rotate the substrate. FIG. 9 depicts two pockets 91 for counterclockwise rotation, and two pockets 93 for clockwise rotation. By including at least two pockets for each rotational direction, the at least two pockets are in balance so that the any potential transverse directional forces cancel each other out in, while still applying a torque to the substrate 2 in order to rotate substrate 2. Although two pockets are depicted for each rotational direction, any number of pockets is contemplated. By regulating the gas flows and vacuum pressures to grooves 92 and 94, respectively, control of the substrate rotation may be accomplished. Although 2 gas flow pockets 91 and 2 gas flow pockets 93 are depicted in FIG. 9, any number of such pockets needed to provide rotational control of the substrate is contemplated.

Base plate 90 may also include gas flow pockets 97 adapted to apply transverse directional forces to provide positioning forces upon substrate 2. Each pocket 97 may be between about 10 μm and about 30 μm deep relative to the top surface of base plate 90. Pockets 97 may have a width of about 10 mm or above, preferably between about 10 mm and about 50 mm. In one embodiment the width may be about 35 mm. Pockets 97 may have a length of about 10 mm or above, preferably between about 10 mm and about 50 mm. In one embodiment the length may be about 35 mm.

Air flow pockets 97 may include grooves 102 and 104 at opposing lengths of the pockets and extending the width of the pockets. Grooves 102 and 104 may be between about 20 μm and about 80 μm deep relative to the top surface of base plate 90. Grooves 102 may be adapted to provide a gas to become a pressure well and grooves 104 may be adapted to provide a vacuum to become a low pressure well. In one embodiment, such as depicted in FIG. 9, grooves 104 consist of one circular groove 104 with pockets 97 extending outwards from groove the circular groove 104. In this embodiment a flow of gas may flow from grooves 102 to grooves 104, and thus exerting a force on the substrate towards the center of base plate 90. A plurality of air flow pockets 97 may be controlled in order to center the substrate over base plate 90. Although four air flow pockets 97 are depicted in FIG. 9, any number of such pockets needed to provide rotational control of the substrate is contemplated. In one embodiment, grooves 102 and groove 104 may be reversed; such the force of the flowing gas is in a direction away from the center of base plate 90. Gas and vacuum may be supplied to grooves 102 and 104, respectively, via corresponding channels in lower base plate 50 as described in relation to FIG. 5.

The substrate may be rotated at speeds of between about 100 rpm (revolutions per minute) and about 1500 rpm, preferably between about 200 rpm and about 1000 rpm. Optionally, a sensor (not shown), such as an optical sensor, may be disposed above or below the base plate to measure the rotation speed. The speed of the rotation may be varied depending upon particular variables that are measured or monitored during the processing of the substrate. For example, process variables known to affect deposition rates, such as temperature or pressure, or a measured or calculated rate of deposition may be utilized to control the speed of rotation of the substrate during processing. For example, the substrate may be rotated at slower speeds during slow deposition rate periods and at faster speeds during faster deposition rate periods.

Figure 11:
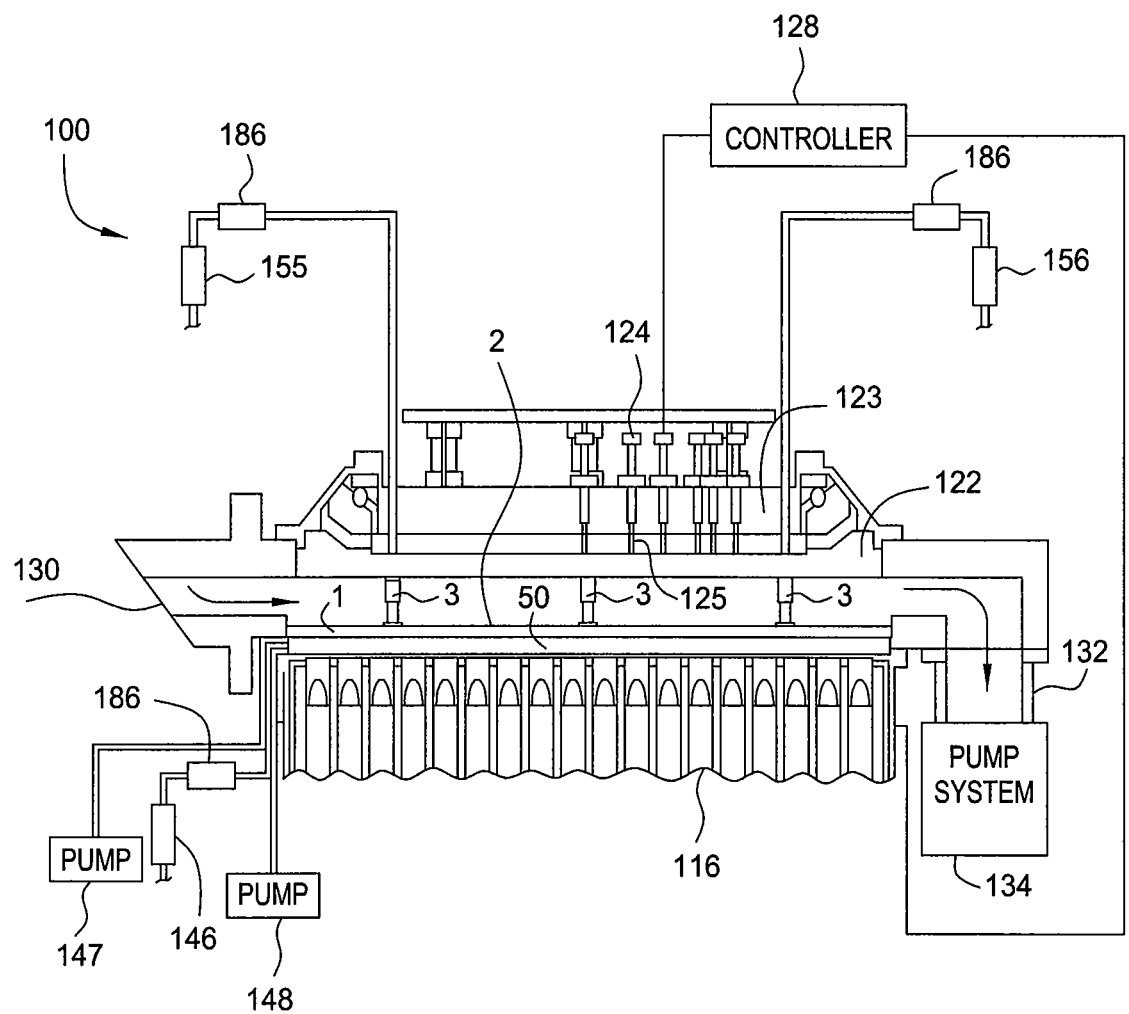
FIG. 11 depicts a sectional view of a processing chamber according to one embodiment of the invention.

FIG. 11 depicts a simplified sectional view of one embodiment of a rapid thermal processing chamber 100 having an apparatus for supporting, positioning and rotating a substrate disposed therein. Although the apparatus is described as utilized within a rapid thermal processing chamber 100, the apparatus may be utilized in other substrate processing systems and ancillary devices such as substrate support platforms adapted for robot handoffs, orientation devices, deposition chamber, etch chambers, electrochemical processing apparatus and chemical mechanical polishing devices, among others, particularly where the minimization of particulate generation is desired.

Substrate 2 may be radiatively heated by a heating lamp assembly 116. The heating lamp assembly 116 may include a plurality of honeycomb tubes in a water jacket assembly. Each tube contains a reflector and a tungsten halogen lamp assembly from which is formed a honeycomb-like pipe arrangement. This close-packed hexagonal arrangement of like pipes provides radiant energy sources with high-power density and good special resolution. In one embodiment, the lamp assembly provides sufficient radiant energy to thermally process the substrate, for example, annealing a silicon layer disposed on the substrate.

Entry and egress of substrate 2 may occur through an access port (not shown). Inside the chamber, substrate 2 may be supported by substrate the support and positioning assembly as described above. FIG. 11 depicts a chamber including both a base plate 101 and the lower base plate 50. Base plate 101 may be any base plate described above, such as base plates 1 and 90. Both base plate 101 and lower base plate 50 may be made from transparent material such as quartz, sapphire, or a hard transparent mineral.

The transparent base plate 101 allows for the substrate to be radiatively heated by heating lamp assembly 116 positioned underneath substrate 2. The radiative heat may thus pass through the transparent substrate support structure in order to heat a bottom surface of substrate 2. The bottom surface of substrate 2 may be more uniform than the top surface of substrate 2, which may contain several devices; all made form varying materials with various ranges of emissivities. Therefore, by heating substrate 2 by radiatively heating the bottom surface of substrate 2, heating of substrate 2 may proceed in a more uniform manner than when substrate 2 is heated by radiatively heating the top surface of substrate 2.

Connected to lower base plate 50 is gas inlet 146 which is connected to filter 186. Gas inlet 146 may provide the gas used to elevate substrate 2. Vacuum may be applied to the lower base plate via pumps 147 and 148. Gas and vacuum may be applied so that a pressure difference between the apertures for providing gas and the apertures for providing vacuum may be between about 5 PSI and about 50 PSI, preferably between about 10 PSI and about 30 PSI. In one embodiment the pressure difference is about 20 PSI. Also connected to lower base plate 50 may be gas sources (not shown) for the slanted apertures 81 and 82 and the gas flow pockets 91, 93, and 97. Additionally, vacuum may be applied to the gas flow pockets 91, 93, and 97, through a plurality of pumps (not shown). Gas and vacuum may be applied to the gas flow pockets so that a pressure difference between the pressure wells and the low pressure wells may be between about 5 PSI and about 100 PSI, preferably between about 10 PSI and about 30 PSI. In one embodiment the pressure difference is about 20 PSI.

Above substrate 2 is a nickel-plated aluminum reflector plate assembly 122 that may have an optically reflective coating facing to enhance the effective emissivity of substrate 2. The optically reflective coating is further described in commonly assigned U.S. Pat. No. 6,839,50, issued Jan. 5, 2005 to Adams and Hunter, which description is incorporated by reference herein. Reflector plate assembly 122 is mounted on a water-cooled base 123. Cool down of substrates may be enhanced by increasing the cooling capacity of the water cooled base 123 and by locating the reflector plate assembly 122 closer to the water cooled base 123. Furthermore, the optical coating may be enhanced to absorb radiated energy when the lamp assembly is off. Cool down of substrates may be further enhanced ejecting gas supplied by gas input 155 through holes in the reflector plate.

In a system designed for processing eight inch (200 mm) silicon wafers, reflector 122 may have a diameter of about 8.9 inches, the separation between substrate 2 and the surface of reflector 122 may be between about 15 and about 25 mm. In a system designed for processing twelve-inch (300 mm) silicon wafers, reflector 122 may have a diameter of about 13 inches, the separation between substrate 2 and the surface of reflector 122 may be between about 20 and about 30 mm.

The temperatures at localized regions of substrate 2 are measured by a plurality of temperature probes 124 that are positioned to measure substrate temperature at different radial locations across the substrate. Temperature probes 124 receive light from inside the processing chamber through optical ports 125, which extend through the top surface of reflector plate assembly 122. While processing chamber 100 typically may have about ten such temperature probes, only some of the probes are shown in FIG. 11. At the reflector plate surface, each optical port may have a diameter of about 0.08 inch. Sapphire light pipes deliver the light received by the optical ports to respective optical detectors (for example, pyrometers), which are used to determine the temperature at the localized regions of substrate 2. Temperature measurements from the optical detectors are received by a controller 128 that controls the radiative output of heating lamp assembly 116. The resulting feedback loop improves the ability of the processing system to uniformly heat substrate 2. Air bearing edge rollers 3 may be attached to reflector plate assembly 122. Gas inlet 156 supplies gas through filter 186 to the air bearing edge rollers.

In order for the optical detectors to measure the temperature of substrate 2, without optical leakage of light effecting the measurements, base plate 1 may have outer ring 13 adhered to it. In this embodiment the base ring is of a dark color in order to absorb light leakage from the lamp assembly. The outer ring 13 may be a carbon based material such, as silicon carbide.

During an annealing processing, gases for the annealing ambient are introduced into processing chamber 100 through an ambient gas input 130. The ambient gases flow across the top surface of substrate 2 and may react with a heated substrate. Excess ambient gases, as well as any reaction by-products, are withdrawn from processing chamber 100 through an ambient gas output 132 by a pump system 134.

The gases used to elevate (introduced via apertures 9 or groove 25), rotate (introduced via slanted apertures 81 and 82, gas flow pockets 91 and 93, or air jets), and position (through air bearing edge rollers 3 and/or gas flow pockets 97) may be the same gas used as processing gas (introduced through gas input 130). Alternatively, the gases may be inert gases such as nitrogen, helium, or argon, mixtures thereof.

One or more sensors (not shown) may be coupled to the chamber body. Generally, the sensors are adapted to detect the elevation of the substrate within the interior volume of the chamber body and provide an output indicative of the distance between the substrate and the top of the base plate 1. The sensors may also be adapted to detect the rotational speed of the substrate and provide an output indicative of the how fast the substrate is rotating on the support assembly.

The controller 128 is coupled to the sensors, lamps, and other elements of the processing chamber. The controller utilizes the positional metric obtained from the sensors to adjust the elevation of the substrate so that both the elevation and the planarity of the substrate seated on the support assembly may be adjusted relative to the lamp assembly.

The controller generally includes a central processing unit (CPU), support circuits and memory. The CPU may be one of any form of computer processor that can be used in an industrial setting for controlling various actions and subprocessors. The memory is coupled to the CPU. The memory, or computer-readable medium, may be one or more of readily available memory such as random access memory (RAM), read only memory (ROM), floppy disk, hard disk, or any other form of digital storage, local or remote. The support circuits are coupled to the CPU for supporting the controller in a conventional manner. These circuits include cache, power supplies, clock circuits, input/output circuitry, subsystems, and the like.

An atmosphere control system is also coupled to the interior volume of the chamber body. The atmosphere control system includes throttle valves and pump system 134 for controlling chamber pressure. The atmosphere control system may additionally include gas input 130 and 155 for providing process or other gases to the interior volume. Typically, atmosphere control system provides process gases for thermal deposition procedures.

A method for supporting positioning and rotating the substrate in the processing chamber is stored in the memory of the controller, typically as a software routine. The software routine may also be stored and/or executed by a second CPU (not shown) that is remotely located from the hardware being controlled by the CPU.

The method, when executed by the CPU, allows controller 128 to control the position and rotation of the substrate within the processing chamber so that a thermal or other process may be performed. Although the process of embodiments of the present invention is discussed as being implemented as a software routine, some of the method steps that are disclosed therein may be performed in hardware as well as by the software controller. As such, the embodiments of the invention may be implemented in software as executed upon a computer system, in hardware as an application specific integrated circuit or other type of hardware implementation, or a combination of software and hardware.

In another embodiment, the substrate support unit depicted in FIGS. 1-10 may be used in a conventional chamber where the lamp assembly 116 is positioned above substrate 2.

Figure 12:
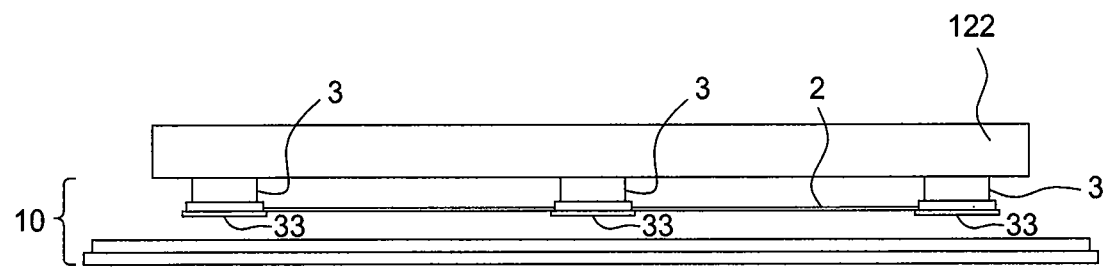
FIG. 12 depicts a side view of the support assembly in a loading mode according to an embodiment of the invention.

FIG. 12 depicts a cross section of support and positioning assembly 10 and reflector plate 122 in a substrate loading mode according to an embodiment of the invention. The air bearing edge rollers 3 are lifted into a loading position so that lift 33 of FIG. 4 provides support to the substrate 2. Lift 33 may be raised by replacing gas through inlet 156 with vacuum. Once the air bearing edge rollers 3 are lifted into a loading position the substrate may be introduced or removed from the chamber via the chamber access port. If a substrate is to be introduced into the chamber, gas inlet 146 and vacuum pump 147 and 148 may be engaged to provide an air cushion before the lifts 33 are lowered to position the substrate 2 into processing mode.

Figure 13:
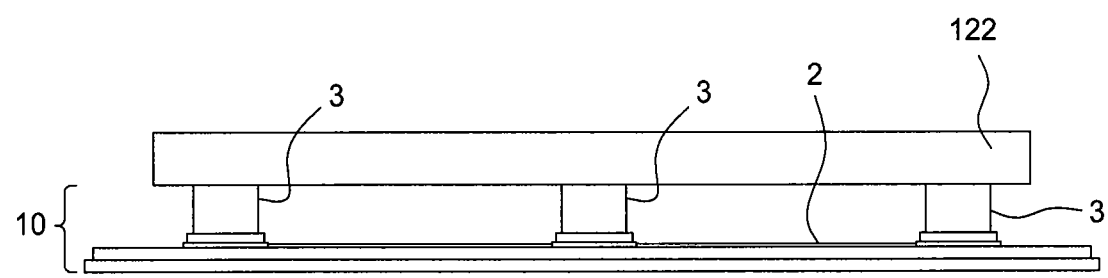
FIG. 13 depicts a side view of the support assembly in a process mode according to an embodiment of the invention.

Once substrate 2 is in a processing mode (FIG. 13), substrate 2 may be rotated by applying gas to the slanted apertures 81, by providing gas from the air jets, or by providing gas and vacuum to the air flow pockets 91 and/or 93. After the substrate has reached a predetermined elevation above base plate 1 and a predetermined rotational speed and a desired processing gas flow has been reached, lamp assembly 116 may be engaged to perform the heating of the substrate. The lamp assembly may be engaged between about % of a second and about 15 seconds, preferably between about 1 second to about 5 seconds. The time the lamp assembly is engaged may depend on the substrate to be processed as well as the process gas chemistry.

By rapidly rotating the substrate even heat distribution may be obtained. Furthermore, because substrate 2 is not in contact with the substrate support surface uneven thermal losses are kept at a minimum. Some thermal heat loss may occur upon substrate 2 coming in contact with sleeve 31 of air bearing edge rollers 3, however this loss is minimal compared to the heat loss found in conventional substrate supports, and may be minimized by applying the transverse directional forces of pockets 97 to position substrate 2 within the center of base plate 90. Furthermore, contamination is reduced because there is no contact between the substrate and the support assembly.

While the foregoing is directed to the preferred embodiment of the present invention, other and further embodiments of the invention may be devised without departing from the basic scope thereof. The scope of the invention is determined by the claims that follow.

What is claimed is:

1. A substrate support assembly for a substrate, comprising:
a base configured to provide a first flow of gas for elevating the substrate; and
a plurality of air bearing edge rollers disposed around the base and air friction pockets disposed in the base, and wherein each air bearing edge roller comprises a sleeve adapted to float on a second flow of gas.

2. The substrate support assembly of claim 1, wherein the base comprises a first plate with a first plurality of apertures adapted to direct the first flow of gas.

3. The substrate support assembly of claim 2, further comprising a second plate positioned under and in contact with the first plate, wherein the second plate comprises a first conduit for directing the first flow of gas to the first plurality of apertures.

4. The substrate support assembly of claim 3, wherein the first plate further comprises a second plurality of apertures adapted to provide vacuum.

5. The substrate support assembly of claim 4, wherein the second plate further comprises a second conduit for directing the vacuum to the second plurality of apertures.

6. The substrate support assembly of claim 2, wherein the first plate comprises a first groove adapted to direct the first flow of gas.

7. The substrate support assembly of claim 6, wherein the first plate further comprises a second groove adapted to provide vacuum.

8. The substrate support assembly of claim 1, further comprising a thermal edge barrier disposed around the base.

9. The substrate support assembly of claim 1, further comprising a heat source.

10. The substrate support assembly of claim 2, wherein the first plate comprises a transparent material.

11. A substrate support, comprising:
a first plate with a first plurality of slanted apertures in communication with a first qas supply, the first plurality of slanted apertures providing a rotational gas flow in a first direction; and
a plurality of air bearing edge rollers disposed around the base first plate, wherein each air bearing edge roller comprises a sleeve in communication with a second gas supply.

12. A substrate support comprising a first plate with a first plurality of slanted apertures providing a rotational gas flow in a first direction, and a second plurality of slanted apertures providing a rotational gas flow in a second direction opposite to the first direction, wherein each of the first plurality of slanted apertures and the second plurality of slanted apertures is arranged concentrically about a center of the first plate at a different distance from the center of the first plate, said substrate support further comprising a second plate positioned under and in contact with the first plate, wherein the second plate comprises one or more conduits in communication with the first plurality of slanted apertures, the second plurality of slanted apertures, a sleeve of an air bearing edge roller, the first gas supply, the second gas supply, and a third gas supply.

13. The substrate support of claim 12, wherein one of the first plurality of slanted apertures and the second plurality of slanted apertures provides vacuum.

14. A chamber for processing a substrate, comprising:
a heating lamp assembly;
a reflector plate disposed to reflect light from the heating lamp assembly; and
a substrate support assembly disposed between the heating light assembly and the reflector plate, wherein the substrate support assembly includes a base with a first plurality of slanted apertures or a plurality of gas flow pockets for elevating and rotating a substrate, wherein the substrate support assembly further comprises: a plurality of air bearing edge rollers disposed around the base, wherein each air bearing edge roller comprises a sleeve in communication with a gas supply.

* * * * *

UNITED STATES PATENT AND TRADEMARK OFFICE
CERTIFICATE OF CORRECTION

PATENT NO. : 8,490,660 B2  
APPLICATION NO. : 13/294709  
DATED : July 23, 2013  
INVENTOR(S) : Koelmel et al.

Page 1 of 1

It is certified that error appears in the above-identified patent and that said Letters Patent is hereby corrected as shown below:

In the Specification:

In the Detailed Description of the Preferred Embodiment:

Column 11, Line 61, please delete "%" and insert --1/2-- therefor;

In Claims:

Column 12, Claim 11, Line 53, please delete "qas" and insert --gas-- therefor;

Column 12, Claim 11, Line 57, please delete "base".

Signed and Sealed this
Twenty-fourth Day of September, 2013

Teresa Stanek Rea
*Deputy Director of the United States Patent and Trademark Office*